(12) United States Patent
Aoki et al.

(10) Patent No.: US 7,211,987 B2
(45) Date of Patent: *May 1, 2007

(54) ELECTRIC DEVICE WITH INTELLIGENT BATTERY SYSTEM THEREIN

(75) Inventors: Takaaki Aoki, Ebinashi (JP); Masaki Kobayashi, Tokyo (JP); Atsushi Kumaki, Yokohama (JP); Takeshi Matsumoto, Fujisawa (JP); Shigefumi Odaohhara, Yamato (JP); Mizuho Tadokoro, Yamato (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 468 days.

This patent is subject to a terminal disclaimer.

(21) Appl. No.: 10/245,641

(22) Filed: Sep. 17, 2002

(65) Prior Publication Data

US 2003/0057918 A1  Mar. 27, 2003

(30) Foreign Application Priority Data

Sep. 19, 2001 (JP) .............................. 2001-284486

(51) Int. Cl.
  *H02J 7/00* (2006.01)
  *G01N 27/42* (2006.01)

(52) U.S. Cl. ...................................... 320/134; 324/425

(58) Field of Classification Search ................ 320/134, 320/132, 136, 137, 149, 112, 125, 127, 128, 320/139, 4, 5, 12, 13, 14, 21, 30, 31, 35, 320/43, 44, 48, 104; 324/431, 426, 427, 324/428, 433, 425, 432

See application file for complete search history.

(56) References Cited

U.S. PATENT DOCUMENTS

| | | | | |
|---|---|---|---|---|
| 5,469,816 A | * | 11/1995 | Murakawa et al. | 123/2 |
| 5,537,390 A | * | 7/1996 | Horiba et al. | 320/134 |
| 5,539,318 A | * | 7/1996 | Sasaki | 324/428 |
| 5,561,362 A | * | 10/1996 | Kawamura et al. | 320/134 |
| 5,675,258 A | * | 10/1997 | Kadouchi et al. | 324/433 |
| 5,698,962 A | * | 12/1997 | Sakai et al. | 324/431 |
| 5,869,951 A | * | 2/1999 | Takahashi | 320/104 |
| 5,886,527 A | * | 3/1999 | Ito | 324/431 |
| 5,895,440 A | * | 4/1999 | Proctor et al. | 702/63 |
| 5,939,861 A | * | 8/1999 | Joko et al. | 320/122 |
| 6,169,387 B1 | * | 1/2001 | Kaib | 320/132 |
| 6,198,254 B1 | * | 3/2001 | Satake et al. | 320/132 |
| 6,294,894 B1 | * | 9/2001 | Ochiai et al. | 320/132 |
| 6,465,984 B2 | * | 10/2002 | Fukuoka et al. | 320/112 |
| 6,910,143 B2 | * | 6/2005 | Odaohhara et al. | 713/340 |
| 2001/0033169 A1 | * | 10/2001 | Singh et al. | 324/426 |

* cited by examiner

FOREIGN PATENT DOCUMENTS

| | | |
|---|---|---|
| JP | 08-075833 | 3/1996 |
| JP | 11-040209 | 2/1999 |
| JP | 2000-023377 | 1/2000 |
| JP | 2000-078759 | 3/2000 |
| JP | 2000-260486 | 9/2000 |

*Primary Examiner*—Karl Easthom
*Assistant Examiner*—Richard V. Muralidar
(74) *Attorney, Agent, or Firm*—John L. Rogitz

(57) ABSTRACT

A computer provided with an intelligent battery 52 for charging/discharging, the intelligent battery 52 supplying power to a main system unit, wherein the intelligent battery 52 includes: a voltage measuring circuit 70 for measuring a battery voltage of the intelligent battery 52; a current measuring circuit 63 for measuring a charging/discharging current of the intelligent battery 52; a temperature measuring circuit 90 for measuring a temperature of the intelligent battery 52; and a CPU 62 for periodically reading the battery voltage measured by the voltage measuring circuit 70, the charging/discharging current measured by the current measuring circuit 63, and the temperature measured by the temperature measuring circuit 90 so as to manage a capacity deterioration of the battery due to a storage deterioration and a cycle deterioration, and wherein the main system unit includes an embedded controller 41 for receiving information about the capacity deterioration from the CPU 62 of the battery.

3 Claims, 8 Drawing Sheets

FIGURE 5

STORAGE DETERIORATION TABLE

| RESIDUAL CAPACITY | TEMPERATURE | | | | |
|---|---|---|---|---|---|
| | -10degC | 20degC | 30degC | 40degC | 50degC |
| 0% | | | | .0mAh | |
| 10% | | | | 0.008mAh | |
| 20% | | | | 0.016mAh | |
| 30% | | | | 0.029mAh | |
| 40% | | | | 0.041mAh | |
| 50% | | | | 0.056mAh | |
| 60% | | | | 0.070mAh | |
| 70% | | | | 0.089mAh | |
| 80% | | | | 0.107mAh | |
| 90% | | | | 0.130mAh | |
| 100% | | | | 0.152mAh | |

ELECTRIC DEVICE WITH INTELLIGENT BATTERY SYSTEM THEREIN

BACKGROUND OF THE INVENTION

1. Field of the Invention

The present invention relates to an electric device containing a battery that can be used by repeating charging/discharging, and particularly it relates to an electric device that can accommodate capacity deterioration of the battery.

2. Prior Art

Various electric devices including information terminals such as notebook-type personal computers (notebook PCs), PDAs (Personal Digital Assistants), MD (Mini Disc) drives and video cameras, are supplied with power not only directly through a commercial main but also from a battery that can be used by repeating charging/discharging. Nickel-hydrogen batteries or nickel-cadmium batteries are employed as batteries used in the electric devices because of their large capacity and low price. The batteries used in the electric devices also include lithium-ion batteries, which have higher energy density per unit weight than the nickel-cadmium batteries, and lithium-polymer batteries, which use solid polymer instead of liquid electrolyte.

Users strongly desire to know accurately a life of a battery such as nickel-hydrogen battery, nickel-cadmium battery, lithium-ion battery or lithium-polymer battery, because operating time of the battery decreases after the life of the battery has expired. Accordingly, some conventional electric appliances indicate data such as voltage, current, and capacity of its battery to inform a user of time to exchange the battery.

Problems to be Solved by the Invention:

However, since conventional indication of voltage, current and capacity (%) only shows basic data, it is difficult for a user to properly determine a presence of abnormality in the battery or an exchange time of the battery.

Deterioration of a battery can be known from Full Charge Capacity (total capacity). It is possible to know a deterioration degree of a battery by monitoring a change in Full Charge Capacity of the battery. Conventionally, however, it has not been possible to exactly monitor Full Charge Capacity unless the battery, after charged to 100% of capacity, discharges completely to about 0% of capacity (3%, for example). Thus, an exact deterioration degree of the battery can be only known after the battery charging followed by complete discharging. Accordingly, for example, it may take about half a day to get a deterioration degree of a battery in a device, and thus it takes time and effort.

Furthermore, when Full Charge Capacity of a battery is monitored and its deterioration degree is notified to a user, the notified deterioration degree cannot be accurate unless complete discharging is performed just before the notification. Users seldom use batteries to a completely discharged state. Therefore, in order to obtain an exact deterioration degree, it is required to instruct a user to use a battery by charging to 100% capacity and completely discharging. However, usability of a device is not good if complete discharging is required to measure a deterioration degree of its battery.

The present invention solves the technical problems described above.

SUMMARY OF THE INVENTION

An object of the present invention is to detect a battery deterioration degree in a simple manner in a device having a battery.

Another object of the present invention is to timely notify a user of a battery deterioration degree determined.

In view of the objects described above, the present invention provides an electric device having a main unit consuming power and a battery for supplying power to the main unit, comprising: a cycle deterioration monitoring unit for monitoring a cycle deterioration that is a capacity deterioration due to charging/discharging of the battery; and a storage deterioration monitoring unit for monitoring a storage deterioration that is a capacity deterioration due to storage of the battery.

Preferably, the electric device according to the present invention further comprises: a deterioration degree recognizing unit for recognizing a deterioration degree of the battery based on the cycle deterioration monitored by the cycle deterioration monitoring unit, and on the storage deterioration monitored by the storage deterioration monitoring unit; and a deterioration degree indicating unit for indicating the deterioration degree recognized by the deterioration degree recognizing unit. Such a device is desirable in that it can instruct a user to properly handle the battery.

Further, an electric device according to the present invention comprises: a main unit consuming power; and a battery for supplying power to the main unit, wherein a value of total capacity (Full Charge Capacity) of the battery is updated when discharging is completed, and the value of total capacity (Full Charge Capacity) of the battery is updated depending on non-operative state of the battery. Here, the phrase "discharging is completed" means not only the case where the capacity is exactly 0%, but also a case where the capacity is about 0%, as well as a case where the capacity is in a level substantially equivalent to 0% in effect (3%, for example).

From another point of view, the present invention is a computer provided with a battery for charging/discharging, the battery supplying power to a main system unit, wherein the battery comprises: a voltage measuring circuit for measuring a battery voltage of the battery; a current measuring circuit for measuring a charging/discharging current of the battery; a temperature measuring circuit for measuring temperature of the battery; and a CPU for periodically reading the battery voltage measured by the voltage measuring circuit, the charging/discharging current measured by the current measuring circuit, and the temperature measured by the temperature measuring circuit so as to manage a capacity deterioration of the battery, and wherein the main system unit comprises a controller for receiving information about the capacity deterioration from the CPU of the battery.

A computer according to the present invention comprises: a storing unit for storing information about storage deterioration characteristics inherent in the battery; a battery capacity obtaining a battery capacity of the battery once for a unit of time; a battery temperature obtaining unit for obtaining unit for obtaining a temperature of the battery once for a unit of time; and a storage deterioration value obtaining unit for obtaining a storage deterioration value corresponding to the obtained battery capacity and the obtained temperature based on information about the storage deterioration characteristics stored in the storing unit.

The computer further comprising an FCC correcting unit for correcting a total capacity (Full Charge Capacity) of the battery based on the storage deterioration value obtained by the storage deterioration value obtaining unit, can correct the total capacity even if discharging is not completed.

A computer according to the present invention comprises: an information obtaining unit for obtaining information about a capacity of a battery, which varies depending on non-operative state where the battery is not charged/discharged; and an indication unit for indicating predetermined information such as information about a deterioration degree of the battery, based on information about the capacity obtained by the information obtaining unit.

The present invention may also be an intelligent battery attached to an electric device, for supplying power to the electric device, comprising: a cycle deterioration monitoring unit for monitoring a cycle deterioration that is a capacity deterioration due to charging/discharging of the battery; a storage deterioration monitoring unit for monitoring a storage deterioration that is a capacity deterioration due to storage of the battery; and a correcting unit for correcting a value of total capacity (Full Charge Capacity) of the battery based on the cycle deterioration monitored by the cycle deterioration monitoring unit, the storage deterioration monitored by the storage deterioration monitoring unit; and a deterioration degree calculating unit for calculating a deterioration degree of the battery based on the value of total capacity (Full Charge Capacity) corrected by the correcting unit.

An intelligent battery according to the present invention comprises: an initial value storing unit for storing a value of total capacity (Full Charge Capacity) of the battery at an initial state or a design value of the battery; an FCC updating unit for updating the value of total capacity (Full Charge Capacity) of the battery based on non-operative state of the battery; and a deterioration degree measuring unit for measuring a deterioration degree based on the value of total capacity (Full Charge Capacity) stored in the initial value storing unit and the value of total capacity (Full Charge Capacity) updated by the FCC updating unit.

The present invention also provides a total capacity correcting method for correcting a total capacity (Full Charge Capacity) of a battery. The total capacity correcting method according to the present invention comprises the steps of: obtaining a battery capacity of the battery; obtaining a temperature of the battery; obtaining a storage deterioration value based on storage deterioration characteristics obtained in advance, based on the obtained battery capacity and temperature; and correcting the total capacity (Full Charge Capacity) based on the obtained storage deterioration value. Further, a total capacity correcting method according to the present invention also comprises the steps of: integrating an charging amount for the battery; determining whether the integrated charging amount reaches a total capacity (Full Charge Capacity) monitored in advance, or not; and incrementing a cycle count when the integrated charging amount reaches the total capacity (Full Charge Capacity), and performing correction for a deterioration value based on cycle deterioration to calculate a modified total capacity (Full Charge Capacity).

The present invention also provides a deterioration value recognizing method for recognizing deterioration value of a battery. The deterioration value recognizing method according to the invention comprises steps of: monitoring a cycle deterioration that is a capacity deterioration due to charging/discharging of the battery; monitoring a storage deterioration that is a capacity deterioration due to storage of the battery; and recognizing the deterioration value of the battery based on the monitored cycle deterioration and storage deterioration.

The present invention also provides a program to be executed in a computer that can be provided with a battery for supplying power by charging/discharging. Such a program implements at least the functions described above in a computer. A method for providing such a program involves, for example, reading the program stored in a storage medium such as a CD-ROM by means of, for example, a reading unit for the storage medium in a CD-ROM drive or the like. The program may also be transmitted from a program transmitter through a network such as Internet to install it in the computer.

BRIEF DESCRIPTION OF THE DRAWINGS

FIG. 5 shows an example of a storage deterioration table to be prepared;

DESCRIPTION OF PREFERRED EMBODIMENT

Now, the present invention will be described in detail with respect to embodiments shown in the appended drawings.

Figure 1:
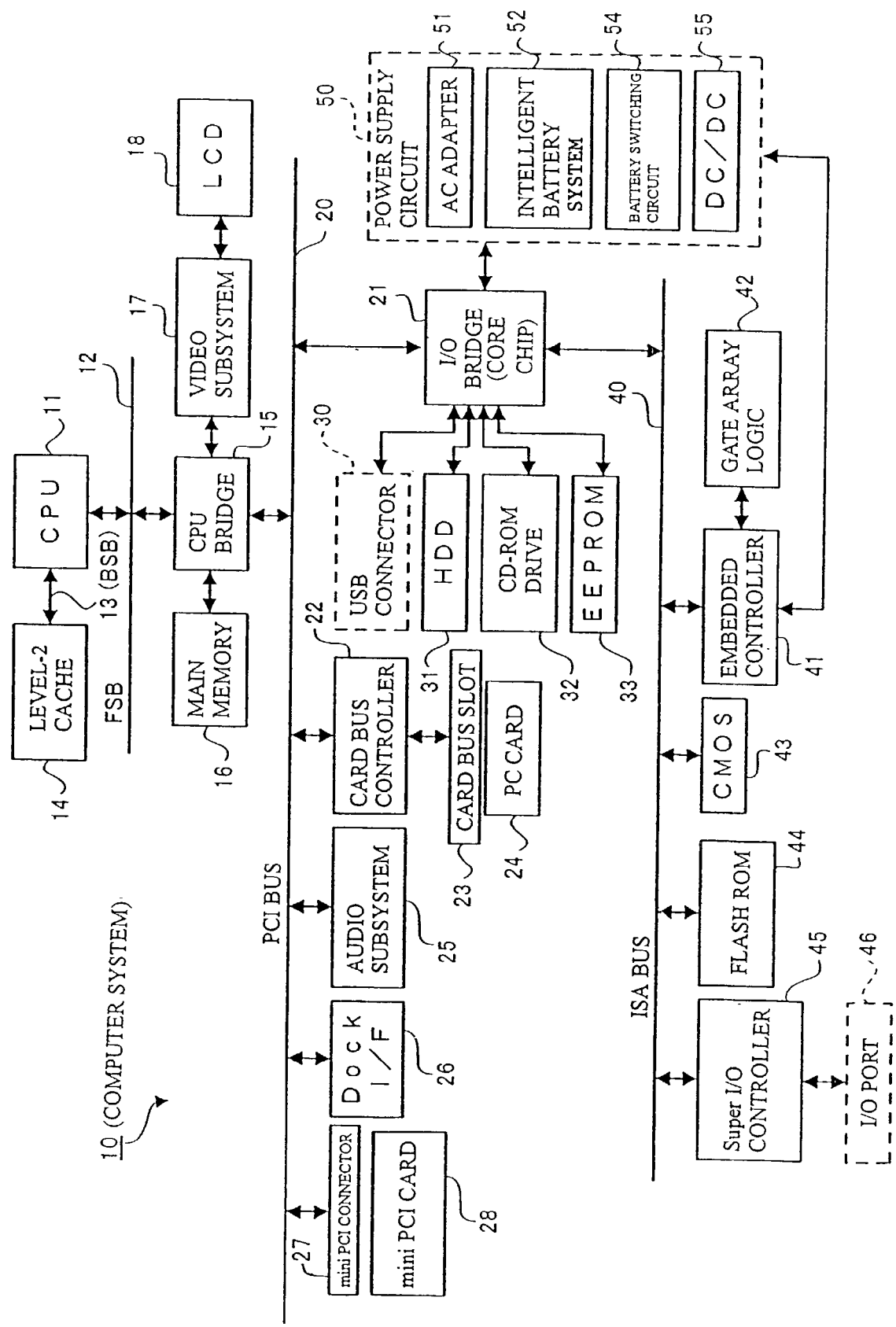
FIG. 1 shows a hardware configuration of a computer system according to an embodiment of the present invention.

FIG. 1 shows a hardware configuration of a computer system 10 according to the present invention. A computer having the computer system 10 is configured, for example, as a notebook PC (notebook type personal computer) provided with a predetermined OS (operating system) in compliance with OADG (Open Architecture Developer's Group).

In the computer system 10 shown in FIG. 1, a CPU 11 functions as a brain for the entire computer system 10, and executes various programs under the control of the OS. The CPU 11 is interconnected with each component via three types of buses: a FSB (Front Side Bus) 12 that is a system bus; a PCI (Peripheral Component Interconnect) bus 20 that is a high-speed bus for I/O devices; and ISA (Industry Standard Architecture) bus 40 that is a low-speed bus for I/O devices. The CPU 11 provides a high-speed process by storing program codes or data in the cache memory. Recently, a SRAM of 128K bytes or so is integrated as a level-1 cache inside the CPU 11, and a level-2 cache 14 of 512K to 2M bytes or so is provided through a BSB (Back Side bus) 13 that is an exclusive bus in order to supplement an insufficient capacity. It should be noted that the cost can be reduced by eliminating the BSB 13 and connecting the level-2 cache 14 to the FSB 12 to avoid use of a package with many terminals.

The FSB 12 and PCI bus 20 are in communication with each other via a CPU bridge (host-PCI bridge) 15 called a memory/PCI chip. The CPU bridge 15 comprises a memory controller function for controlling access operation to a main memory 16 and a data buffer for accommodating the difference in data transfer rate between the FSB 12 and the PCI bus 20. The main memory 16 is a writable memory, which is used as an area for reading execution programs of the CPU 11, or as an area for writing process data of the execution programs. For example, it may comprise several DRAM chips of, for example, 64 MB, as the standard, allowing expansion to 320 MB. The execution programs include various drivers for hardware-operation of the OS and the peripheral devices, application programs for specific works, and firmware such as BIOS (Basic Input/Output System) stored in a flash ROM 44 described later.

A video subsystem 17 is a subsystem for implementing functions for video and includes a video controller. The video controller processes a rendering instruction from the CPU 11 to write the processed rendering information into a video memory, and reads out the rendering information from the video memory to output it as rendering data on a liquid crystal display (LCD) 18.

The PCI bus 20 is a bus capable of transferring data with a relatively high speed, and is standardized by a specification with a data bus width of 32 bits or 64 bits, a maximum operation frequency of 33 MHz or 66 MHz, and a maximum data transfer rate of 132 MB/sec or 528 MB/sec. An IO bridge 21, a card bus controller 22, an audio subsystem 25, a docking station interface (Dock I/F) 26, and mini PCI connector 27 are connected to the PCI bus 20, respectively.

The card bus controller 22 is controller dedicated to directly couple a bus signal on the PCI bus 20 to an interface connector (card bus) of a card bus slot 23, into which a PC card 24 can be inserted. The docking station interface 26 is hardware for connecting a docking station (not shown) that is a function extension device of the computer system 10. When the notebook PC is set with the docking station, various hardware elements connected to the internal bus of the docking station are connected to the PCI bus 20 via the docking station interface 26. A mini PCI card 28 is connected to the mini PCI connector 27.

The I/O bridge 21 has a bridge function between the PCI bus 20 and ISA bus 40. It also has a DMA controller function, a programmable interruption controller (PCI) function, a programmable interval timer (PIT) function, an IDE (Integrated Device Electronics) interface function, a USB (Universal Serial Bus) function, and an SMB (System Management Bus) interface function. It also comprises a real time clock (RTC) inside it.

The DMA controller function is a function for performing data transfer between peripherals such as an FDD and the main memory 16 without help of the CPU 11. The PCI function is a function for performing a predetermined program (interrupt handler) in response to an interruption request (IRQ) from the peripherals. The PIT function is a function for generating a timer signal at a predetermined cycle. A CD-ROM drive 32 as well as an IDE hard disk drive (HDD) 31 is ATAPI (AT Attachment Packet Interface) connected to an interface provided by the IDE interface function. Instead of the CD-ROM drive 32, another type of IDE device such as DVD (Digital Versatile Disc) drive may by connected to the interface. External storages such as the HDD 31 and the CD-ROM drive 32 are accommodated, for example, in a containing space in the notebook PC's main unit called a "media bay" or "device bay". The external storages that are installed according to the standard may be installed exclusively and in such a way that they can be exchanged for another device such as an FDD or battery pack.

The I/O bridge 21 comprises a USB port, which is connected to a USB connector 30 provided, for example, on a wall of the notebook PC's main unit. An EEPROM 33 is also connected to the I/O bridge 21 via an SM bus. The EEPROM 33 is a memory for storing information such as a password or supervisor password registered by the user, and the product serial number, and is nonvolatile and configured such that the stored data is electrically rewritable.

Additionally, the I/O bridge 21 is connected to a power supply circuit 50. The power supply circuit 50 comprises an AC adapter 51 connected to a commercial main of AC 100 V for AC/DC conversion, an intelligent battery system 52 as a battery (second battery), a battery switching circuit 54 for charging the intelligent battery 52 and switching power supply paths from the AC adapter 51 and the intelligent battery 52, and a DC/DC converter 55 for generating constant DC voltage such as +15 V, +5 V, or +3.3 V used in the computer system 10.

In a core chip constituting the I/O bridge 21, there are provided an internal register for managing the state of the power supply of the computer system 10, and a logic (state machine) for managing the state of the power supply of the computer system 10 including operation of the internal register. The logic transmits to and receives from the power supply circuit 50 various signals, and recognizes an actual state of feeding from the power supply circuit 50 to the computer system 10 by the transmission/reception of the signals. The power supply circuit 50 controls supply of power to the computer system 10 according to instructions from the logic.

The ISA bus 40 is a bus with a data transfer rate lower than that of the PCI bus 20 (for example, the maximum data transfer rate of 4 MB/sec for a bus width of 16 bits). An embedded controller 41 connected to a gate array logic 42, CMOS 43, flash ROM 44, and Super I/O controller 45 are connected to the ISA bus 40. The ISA bus 40 is also used to connect peripheral devices such as a keyboard/mouse controller that operates at a relatively low speed. An I/O port 46 is connected to the Super I/O controller 45. The Super I/O controller 45 controls driving of FDD, input/output of parallel data (PIO) via a parallel port, and input/output of serial data (SIO) via a serial port.

The embedded controller 41 controls a keyboard (not shown). It is also connected to the power supply circuit 50 and together with the gate array logic 42 responsible for a part of the power supply management function by power management controller (PMC) embedded therein.

Next, a power supply system with a characteristic configuration of this embodiment will be described.

Figure 2:
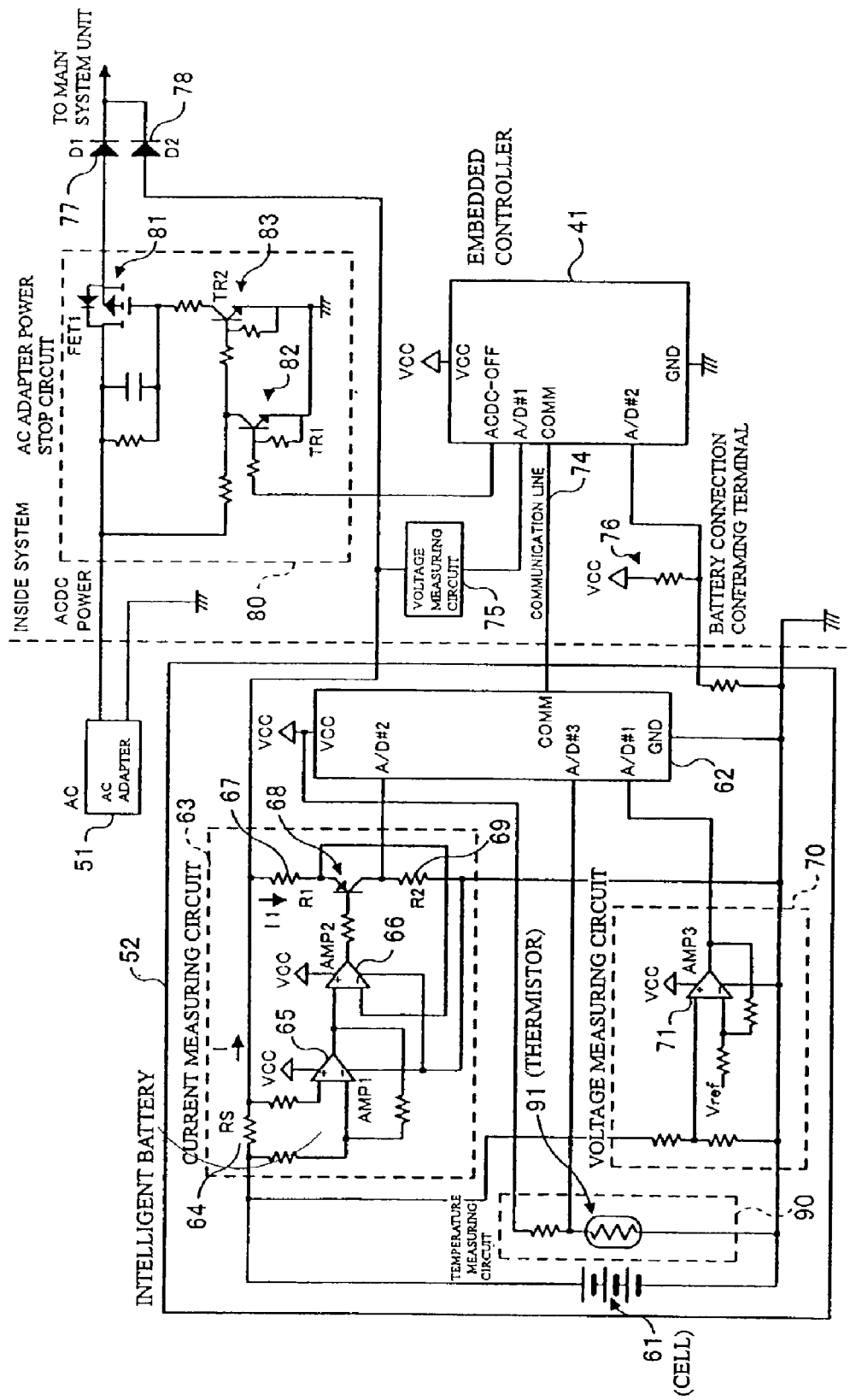
FIG. 2 shows a circuit configuration of a power supply system.

FIG. 2 shows a circuit configuration of the power supply system. The power supply system comprises the power supply circuit 50 as shown in FIG. 1 as well as the embedded controller 41 and AC adapter power stop circuit 80.

The power supply system shown in FIG. 2 includes an AC adapter 51 that is a power supply device connected to a commercial main, and an intelligent battery 52 that is a secondary battery comprising, for example, a lithium-ion battery or the like used through multiple charging/discharging, and is consistent to SBS (Smart Battery System). Power from the AC adapter 51 and the intelligent battery 52 is supplied through a DC/DC converter 55 shown in FIG. 1 to the main unit circuit of the computer system 10.

The power supply system shown in FIG. 2 also includes, in the main system unit, the embedded controller 41 for communicating with the intelligent battery 52 via a communication line 74. It also includes a voltage measuring circuit 75 for measuring a voltage in an over-discharged state and notifying the embedded controller 41 of it, and a battery connection confirming terminal 76 for confirming in an over-discharged state whether the intelligent battery 52 is connected or not. It also comprises an AC adapter power stop circuit 80 for refreshing the intelligent battery 52, and a first diode (D1) 77 and a second diode (D2) 78 for rectifying a power supplied from the AC adapter 51 and a power supplied from the intelligent battery 52 such that these powers do not collide with each other.

In an electric device such as a notebook PC, the AC adapter 51 as a power supply device is usually provided outside a device containing the computer system 10, which is the main (internal) system unit. However, the AC adapter may also be provided inside the housing of the electric device. The main system unit, for example, may be provided with an inlet, into which a cable connector is removably inserted. For example, when the AC adapter 51 is outside, the inlet is configured such that a connector from a cable connected to the AC adapter 51 is removably inserted therein. For example, when the AC adapter 51 is inside the main system unit, the inlet is configured such that a connector directly connected to a commercial main is removably inserted therein. The intelligent battery 52 may be freely removed from the main system unit as a battery pack, or may be provided inside the housing of the electric device.

Next, an internal configuration of the intelligent battery 52 will be described. As shown in FIG. 2, the intelligent battery 52 comprises a cell 61 consisting of several single cells, as a battery for charging/discharging, a CPU 62 for controlling the intelligent battery 52 and communicating with the embedded controller 41 via the communication line 74, a current measuring circuit 63 for obtaining a value of current charged/discharged from the intelligent battery 52, a voltage measuring circuit 70 for obtaining a voltage of the cell 61, and a temperature measuring circuit 90 for measuring a temperature of the cell 61. The cell 61 may be, for example, a lithium-ion battery set consisting of six cells in an arrangement of 2 in parallel×3 in serial (with 1.8 Ah/cell).

The CPU 62 installed in the intelligent battery 52 A/D converts therein analog signals that are measurement results input from the current measuring circuit 63 and voltage measuring circuit 70 so as to acquire information about the battery such as a capacity of the battery. The acquired information about the battery is sent to the embedded controller 41 in the system side through the communication line 74 according to, for example, the SBS protocol.

In the current measuring circuit 63, a current I flowing from the cell 61 generates a potential drop of I×RS in voltage across a resistor (RS) 64. The voltage is differentially amplified by an operational amplifier (AMP1) 65. An operational amplifier (AMP 2) 66 and a transistor 68 generate a current I1 proportional to the output voltage of the operational amplifier (AMP1) 65, which flows through a resistor (R1) 67. Eventually, the value of the current I of the intelligent battery 52 can be converted to a voltage of I1×R2 across a resistor (R2) 69. The voltage (I1×R2) is output at an A/D#2 port of the CPU 62, and is A/D converted by the CPU 62.

The voltage measuring circuit 70 measures a voltage of the intelligent battery 52. Specifically, a voltage of the cell 61 in the intelligent battery 52 is differentially amplified by an operational amplifier (AMP3) 71 and converted. Then, the voltage is lowered, then passed to an A/D#1 port of the CPU 62, and A/D converted by the CPU 62.

In the temperature measuring circuit 90, as shown in FIG. 2, a thermistor (thermal sensor) 91 voltage-divided with a resistor 69 is placed in the proximity of the cell 61, and a voltage generated across the thermistor 91 is passed to an A/D#3 port of the CPU 62. Thus, the CPU 62 reads the voltage from the thermistor 91 periodically, and A/D converts the voltage so as to measure the temperature. In this way, for the intelligent battery 52, temperature information in the battery is periodically acquired.

Thus, the CPU 62 periodically reads charging/discharging currents measured by the current measuring circuit 63, battery voltages measured by the voltage measuring circuit 70, and temperature information obtained by the temperature measuring circuit 90, thereby managing the capacity of the intelligent battery 52 (cell 61). The CPU 62 also sends data on the battery to the embedded controller 41 via the communication line 74. The embedded controller 41 executes control operation such as stopping supply of power from the AC adapter 51 by the AC adapter power stop circuit 80 based on the monitored battery state.

Here, it is possible to manage the battery capacity by performing current integration (AH) or power integration (WH). For management in AH unit, it is essentially possible to manage the capacity of the battery only by using current values measured by the current measuring circuit 63. For management in WH unit, the battery capacity is managed not only by using current values measured by the current measuring circuit 63 but also by using battery voltages measured by the voltage measuring circuit 70. In order to obtain measured current values by using the current measuring circuit 63, the charging current from the intelligent battery 52 (cell 61) and the charging current to the battery are used.

In FIG. 2, in the intelligent battery 52 having the CPU 62 in, for example, the battery pack, the battery capacity is monitored by the CPU 62 in the intelligent battery 52. However, instead of the intelligent battery 52, a dumb battery not having CPU 62 can be used. In such a case, there are provided in the main system unit (inside the system) a current measuring circuit for measuring a charging/discharging current for the dumb battery, and a voltage measuring circuit for measuring a voltage of the dumb battery, and the embedded controller 41 monitores a dumb battery state such as battery capacity.

Next, the AC adapter power stop circuit 80 will be described.

The AC adapter power stop circuit 80 has a function for stopping supply of power from the AC adapter 51. In the computer system 10 (the main system unit), power is supplied through a first diode 77 and a second diode 78 to the main unit's circuit from one of the AC adapter 51 and the intelligent battery 52 (secondary battery), which has a higher voltage value than the other. When the AC adapter 51 is connected, a voltage value at the AC adapter 51 is usually higher than a voltage at the intelligent battery 52, and therefore power is supplied through the first diode 77 from the AC adapter 51 to the main unit's circuit.

Here, for example, when a memory effect occurs in the intelligent battery 52 (a secondary battery), the AC adapter power stop circuit 80 stops supply of power from the connected AC adapter 51, allowing the intelligent battery 52 to completely discharge.

Specifically, when it is desired to perform complete discharging from the intelligent battery 52 (secondary battery), a High signal is supplied from the embedded controller 41 to the AC adapter power stop circuit 80. A first transistor (TR1) 82 of the AC adapter power stop circuit 80 is turned on in response to the High signal. The first transistor 82 turned (ON) causes a second transistor (TR2) 83 to be turned off (OFF), and a FET (FET1) 81 to be turned off. Thus, feeding from the AC adapter 51 is stopped, and supply of power to the first diode 77 is stopped, allowing supply of power from the intelligent battery 52 through the second diode 78 to the main unit's circuit.

Next, measurement of deterioration degree of a battery in this embodiment will be described.

A deterioration of a battery can be defined as a ratio of a "current total capacity of the battery" to an "initial state total capacity of the battery", where the "current total capacity of the battery" is represented by Full Charge Capacity (total capacity: FCC), and the "initial state total capacity of the battery" can be given as a capacity on the design (Design Capacity), or as a Full Charge Capacity at the initial state stored in a memory. As a result, the deterioration degree of the battery can be calculated using the following expressions (1) or (2):

(Full Charge Capacity/Design Capacity)×100[%]     (1)

(Full Charge Capacity/Full Charge Capacity at the initial state stored in the memory)×100[%]     (2)

An exact value of the Full Charge Capacity has not been obtained since it is not updated (no learning) unless discharging is performed completely until the capacity becomes substantially 0% (for example, 3%). In the configuration of this embodiment, even if complete discharging is not performed, automatic correction of Full Charge Capacity is executed in the battery pack (intelligent battery 52) so that the deterioration degree of the battery can be indicated in response to a user's request. For this purpose, there are provided an automatic updating function for automatically updating Full Charge Capacity by using process of cycle deterioration and process of storage deterioration as well as capacity learning through complete discharging.

Here, a process for cycle deterioration will be described.

Figure 3:
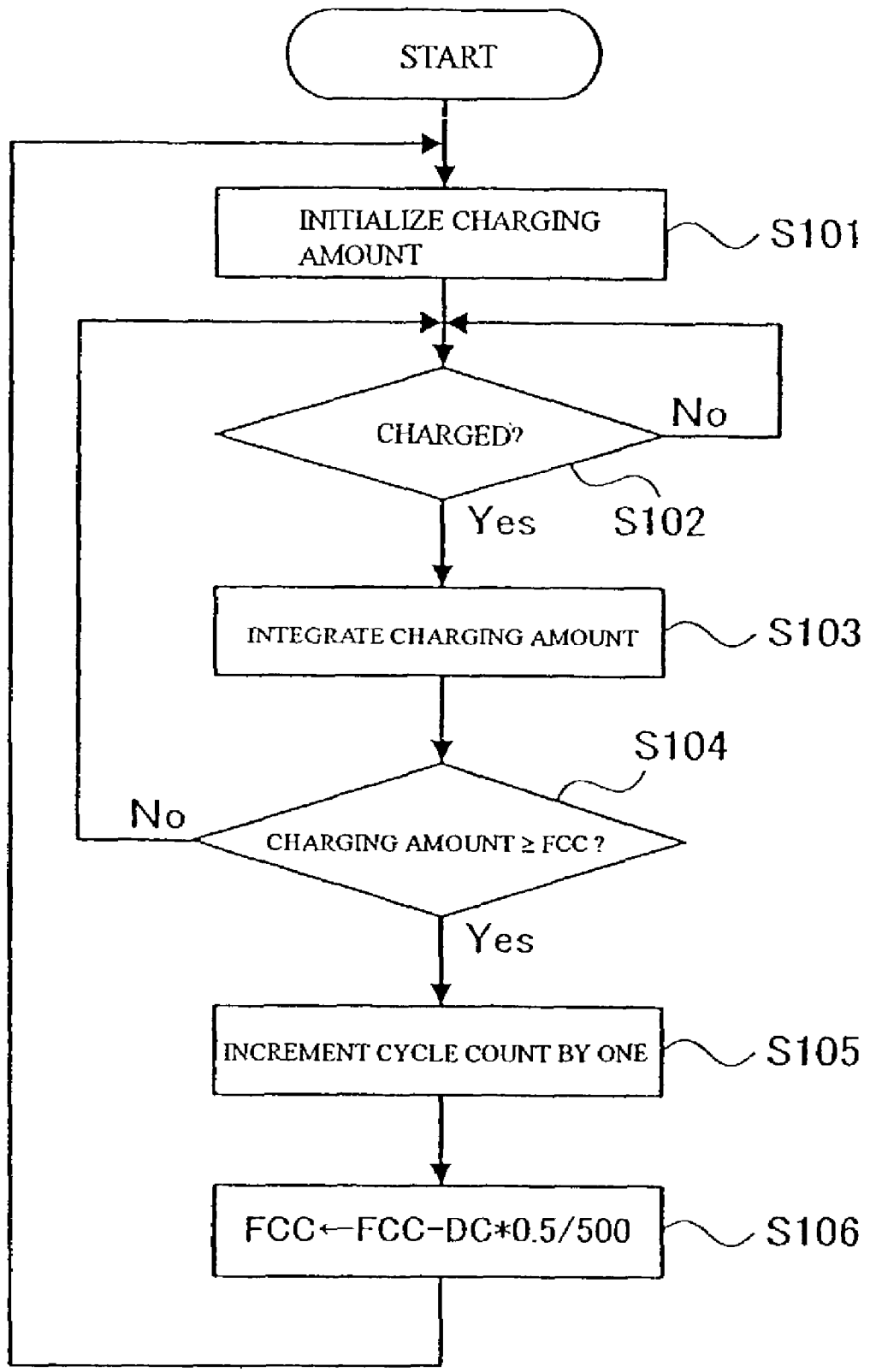
FIG. 3 is a flowchart showing a process of correction for cycle deterioration.

FIG. 3 is a flowchart to show a process of correction for cycle deterioration. In the CPU 62 in the intelligent battery 52, first, the charging amount stored in an internal memory (not shown) of the CPU 62 is initialized, and then a cycle counter for the charging amount is initialized (step 101). After this, it is determined whether charging has been performed or not (step 102). If charging has not been performed, then the process waits for charging, and if charging has been performed, then the charging amount is integrated (step 103).

Next, it is determined whether the entire integrated charging amount reaches a Full Charge Capacity (FCC) or not (step 104). If it does not reach the Full Charge Capacity, then the process returns to step 102. If the integrated charging amount reaches the Full Charge Capacity (a charging amount of 100%), the cycle count is incremented by one (step 105), and the Full Charge Capacity is replaced with a new Full Charge Capacity calculated by:

Full Charge Capacity−Design Capacity×0.5/500

(step 106), then the process returns to step 101.

This expression at step 106 means that when charging/discharging is repeated five hundred times in a predetermined environment (for example, an environment of 25 degrees centigrade and an environment of 45 degrees centigrade), a battery capacity deterioration of about 50% occurs. Specifically, through the measurement of battery capacity carried out by the inventors, it is found that capacity deterioration increases approximately in proportion to the number of cycles and that there is substantially no difference in capacity deterioration between different ambient temperatures. According to the measurement results, a capacity deterioration for each cycle is expressed, irrespective of the ambient temperature, as the following expression (3):

Deteriorated Capacity=Design Capacity×0.5/500
[mAh or mWh]     (3)

Thus, in the process of correction for cycle deterioration in this embodiment, counting the number of cycles is performed by integrating only the charging amount. When the integrated charging amount reaches a charging amount of 100%, it is considered as one count, the cycle count is incremented by one, and a Full Charge Capacity is subtracted by the Deterioration Capacity calculated by the expression (3).

Next, a process for storage deterioration will be described.

Figure 4:
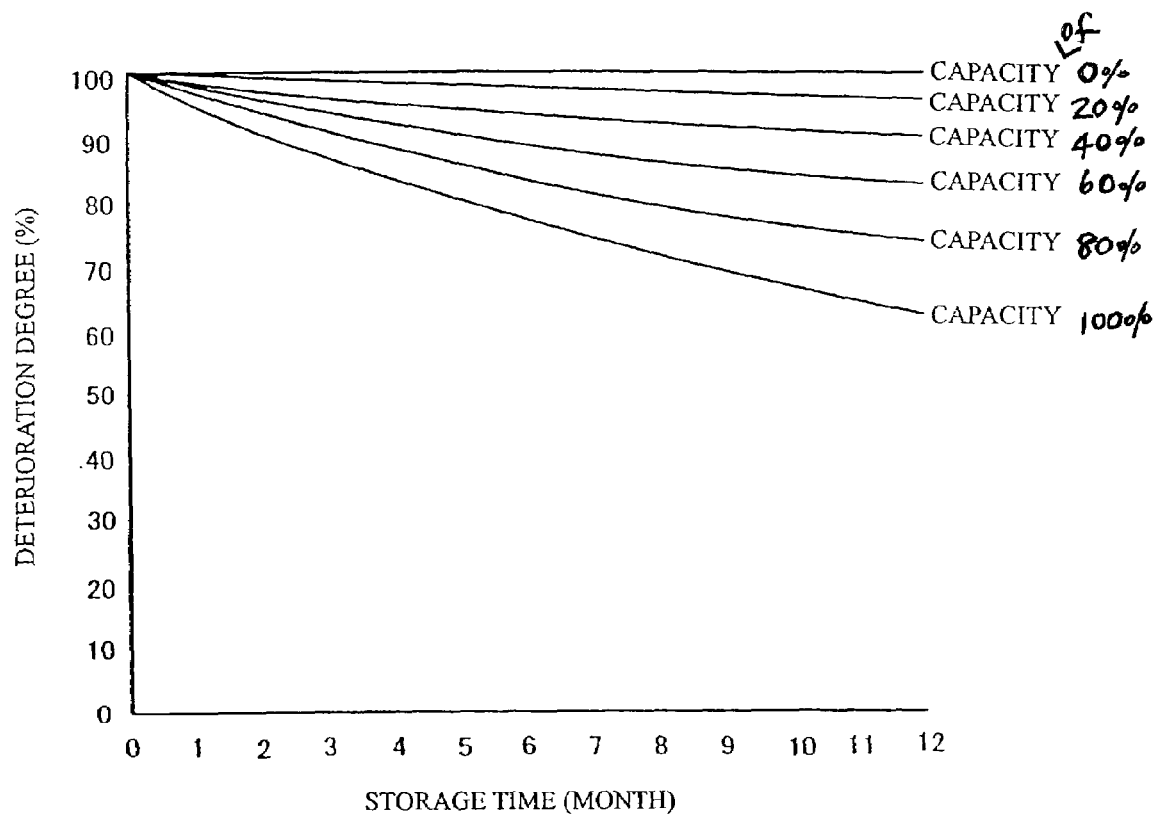
FIG. 4 is a graph showing storage deterioration characteristic of a lithium-ion battery.

FIG. 4 shows a storage deterioration characteristic of lithium-ion battery. Here, the axis of abscissas represent storage time (month), and the axis of ordinates represents deterioration degree (%). For each capacity, deterioration degrees in an environment of 40 degrees centigrade are shown. Data for six capacities of 0% to 100% in increments of 20% is shown in the figure. As shown in FIG. 4, it is understood that the storage deterioration degree of the battery depends on residual capacity of each battery. Actually, a storage deterioration characteristic chart as shown in FIG. 4 may be prepared for each ambient temperature. As can be seen in FIG. 4, the temperature and residual capacity once are determined, a deterioration degree for a unit of time is substantially fixed.

FIG. 5 shows an example of a storage deterioration table to be prepared. The storage deterioration table as shown in FIG. 5 is stored, for example, in the CPU 62 in the intelligent battery 52 so as to correct the residual capacity by the CPU 62. The embedded controller 41 in the main system unit may perpare the table to execute the correction. In FIG. 5, storage deterioration values for a unit of time (mAh) for residual capacities in steps of 10% in an environment of 40 degrees centigrade are provided. In this embodiment, a storage deterioration table for a unit of time (for example, 1 hour) is prepared, and Full Charge Capacity is corrected based on the storage deterioration referring to the prepared storage deterioration table.

In using the table, storage deterioration values (mAh) are obtained from the table information for separate temperature ranges, for example, for a temperature range lower than 10 degrees centigrade, a temperature range not lower than 10 degrees centigrade but lower than 20 degrees centigrade, a temperature range not lower than 20 degrees centigrade but lower than 30 degrees centigrade, a temperature range not lower than 30 degrees centigrade but lower than 40 degrees centigrade, a temperature range not lower than 40 degrees centigrade but lower than 50 degrees centigrade, and a temperature range not lower than 50 degrees centigrade. Additionally, a storage deterioration value for a measured temperature can also be determined by linear interpolation using the values in the table of FIG. 5.

Figure 6:
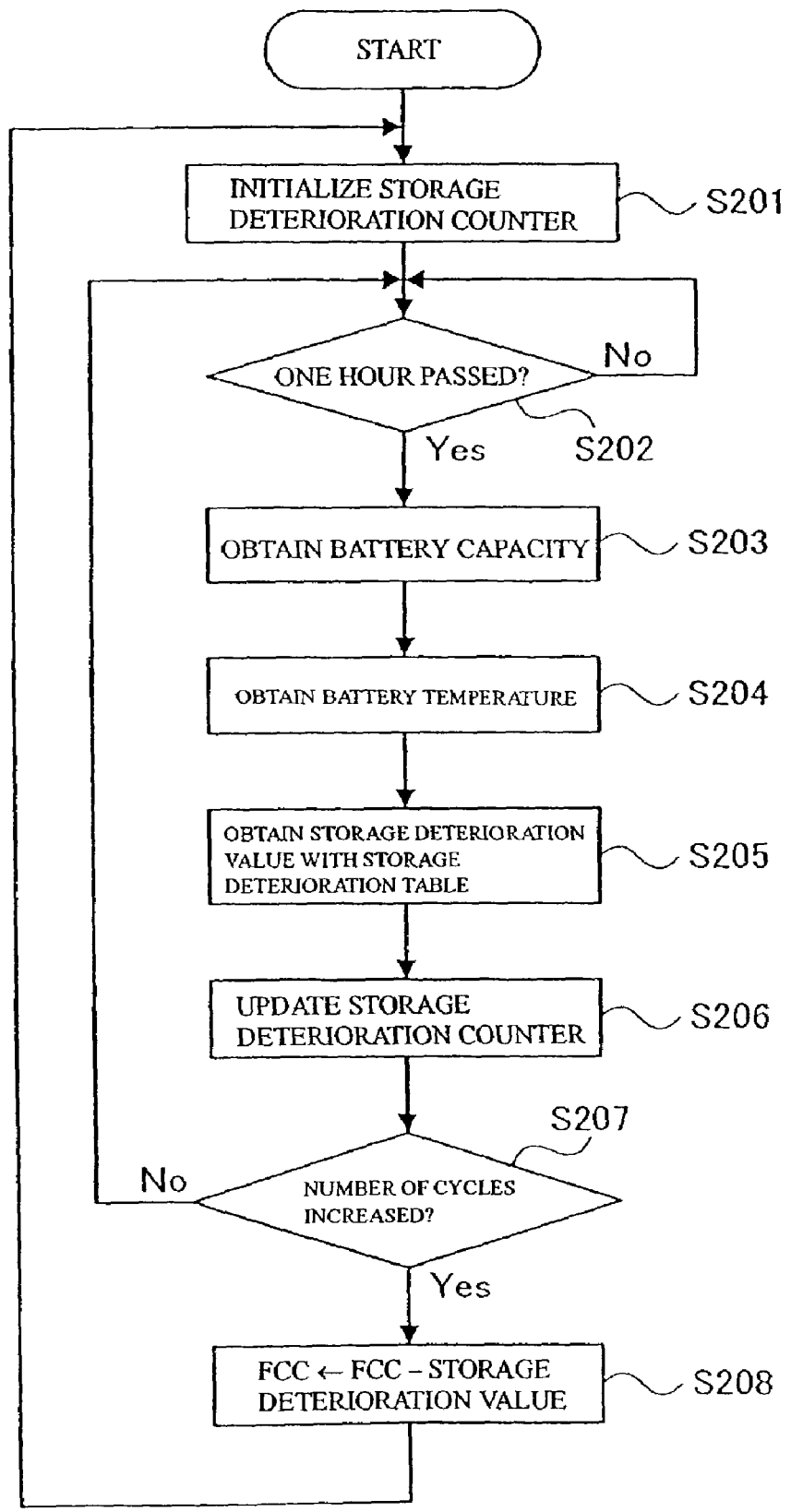
FIG. 6 is a flowchart showing a process of correction for storage deterioration.

FIG. 6 is a flowchart to show a process of correction for storage deterioration. First, in the CPU 62 in the intelligent battery 52, a storage deterioration counter is initialized (step 201). Then, it is determined whether a unit of time, for example, one hour, has passed or not (step 202). Next, a battery capacity is obtained based on a charging/discharging current from the current measuring circuit 63, an output voltage from the voltage measuring circuit 70, and so on (step 203), and a battery temperature is obtained with the temperature measuring circuit 90 (step 204). Using the obtained battery capacity and battery temperature, a storage deterioration value is obtained with a storage deterioration table as shown in FIG. 5 (step 205).

After obtaining the storage deterioration value, the CPU 62 updates the storage deterioration counter (step 206). Next, it is determined whether the cycle number has been increased or not (step 207). If the cycle number has not been increased, then the process returns to step 202. If the cycle number has been increased, then the current Full Charge Capacity is replaced with a new Full Charge Capacity that is the current Full Charge Capacity subtracted by the obtained storage deterioration value, and then the process is completed (step 208), and returns to step 201. In other words, storage deterioration values are integrated, and a subtraction is executed when the cycle count is incremented by one. The storage deterioration value may be obtained based on a predetermined timing with respect to a time point rather than based on the determination at step 207 whether the cycle number is increased or not. It is shown that the storage deterioration value is obtained by using a storage deterioration table as shown in FIG. 5, but it is also possible to calculate it by using approximate expressions representing storage deterioration degree as shown in FIG. 4. Thus, in this embodiment, the subtraction of Full Charge Capacity by a storage deterioration value is executed at the same time of the subtraction by a cycle deterioration.

Next, a process for updating Full Charge Capacity through capacity learning based on complete discharging will be described.

Figure 7:
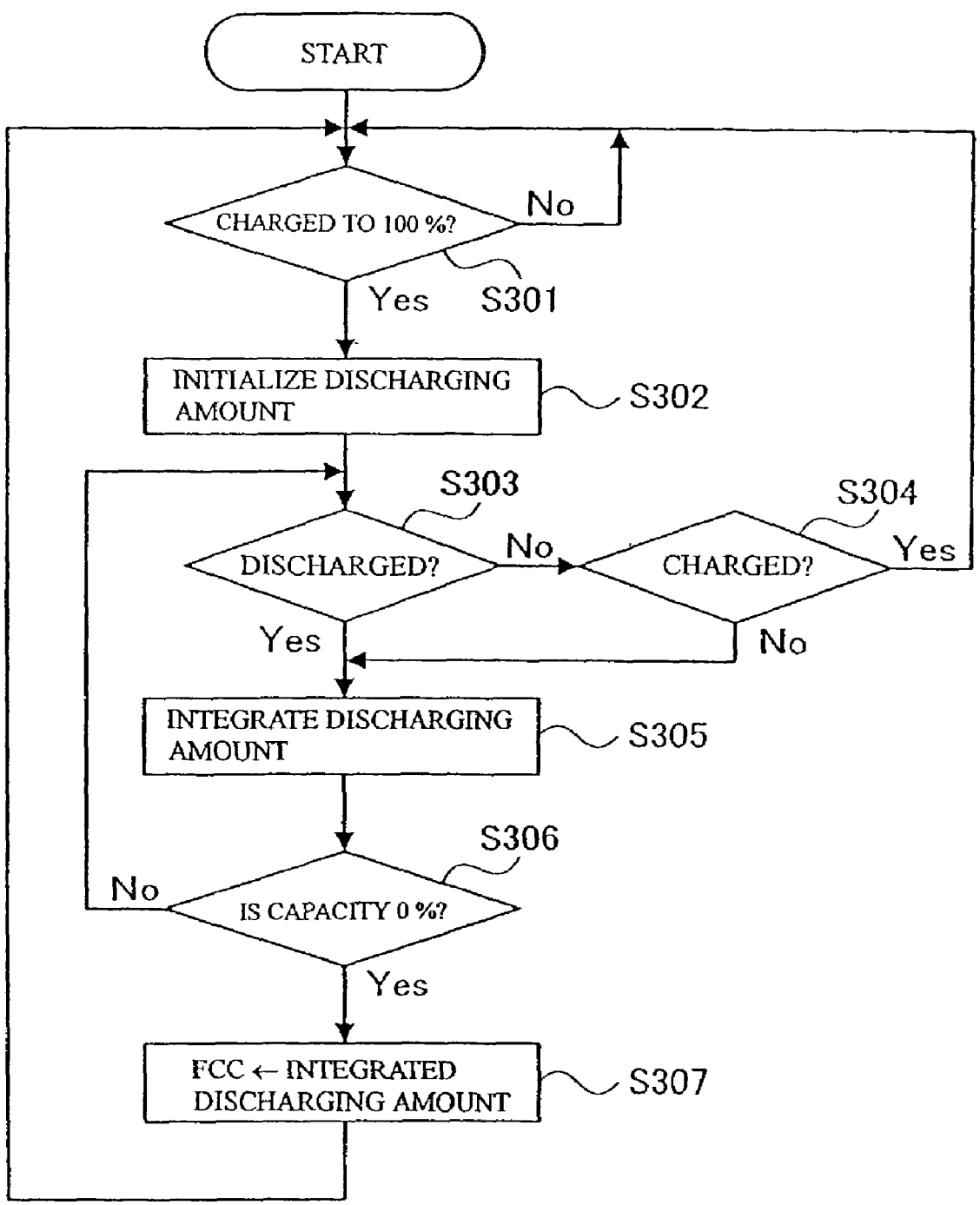
FIG. 7 is a flowchart of updating Full Charge Capacity through capacity learning.

FIG. 7 shows a flowchart for updating of Full Charge Capacity through capacity learning. First, it is determined whether charging has been performed to 100% or not (step 301). If charging has not been performed to 100%, then the process stands by, and if charging has been performed to 100%, then the amount of discharging is initialized (step 302). Then, it is determined whether discharging takes place or not (step 303). If discharging takes place, then process returns to step 305, and if charging does not take place, it is determined whether charging takes place (step 304). If charging takes place, then the process returns to step 301 to determine whether the charging takes place to 100% or not. If the charging does not take place, then the process returns to step 305.

At step 305, the amount of discharging is integrated, it is determined based on the integrated amount of discharging whether the capacity reaches 0% or not (step 306). This determination does not have to be made based on whether the capacity reaches just 0%, and the determination may be made whether the capacity reaches substantially 0% (for example, 3%), which is regarded as a substantially completely discharged state in effect. If the capacity is not 0% at step 306, the process returns to step 303, and if the capacity is 0%, Full Charge Capacity is set to the integrated amount of discharging calculated at step 305 (step 307), and the process returns to step 301.

Thus, in this embodiment, Full Charge Capacity is corrected based on the cycle deterioration described above in conjunction with FIG. 3, as well as on the storage deterioration described above in conjunction with FIGS. 4 to 6, so that the Full Charge Capacity is updated each time the cycle count is incremented. As a result, the battery can always retain a very accurate Full Charge Capacity value even if complete discharging does not take place, so that a user can obtain a deterioration degree of the battery immediately. It should be noted that if complete discharging has been performed, the Full Charge Capacity is updated by using an exact capacity based on current value measurement as described above in conjunction with FIG. 7.

Thus, data on the Full Charge Capacity acquired by the CPU 62 of the intelligent battery 52 is sent from the CPU 62 to the embedded controller 41 in response to a command transmitted from the embedded controller 41. The data is represented in a unit such as mAh or 10 mWh. The command transmitted from the embedded controller 41 to the intelligent battery 52 determines which of these units is used for the transmitted data. The data on the Full Charge Capacity is in word (2 bytes), and an unsigned integer. With the unit in mAh used, data of 0 to 65535 mAh can be sent, and with the unit in 10 mWh used, data of 0 to 655350 mWh can be sent.

Figure 8:
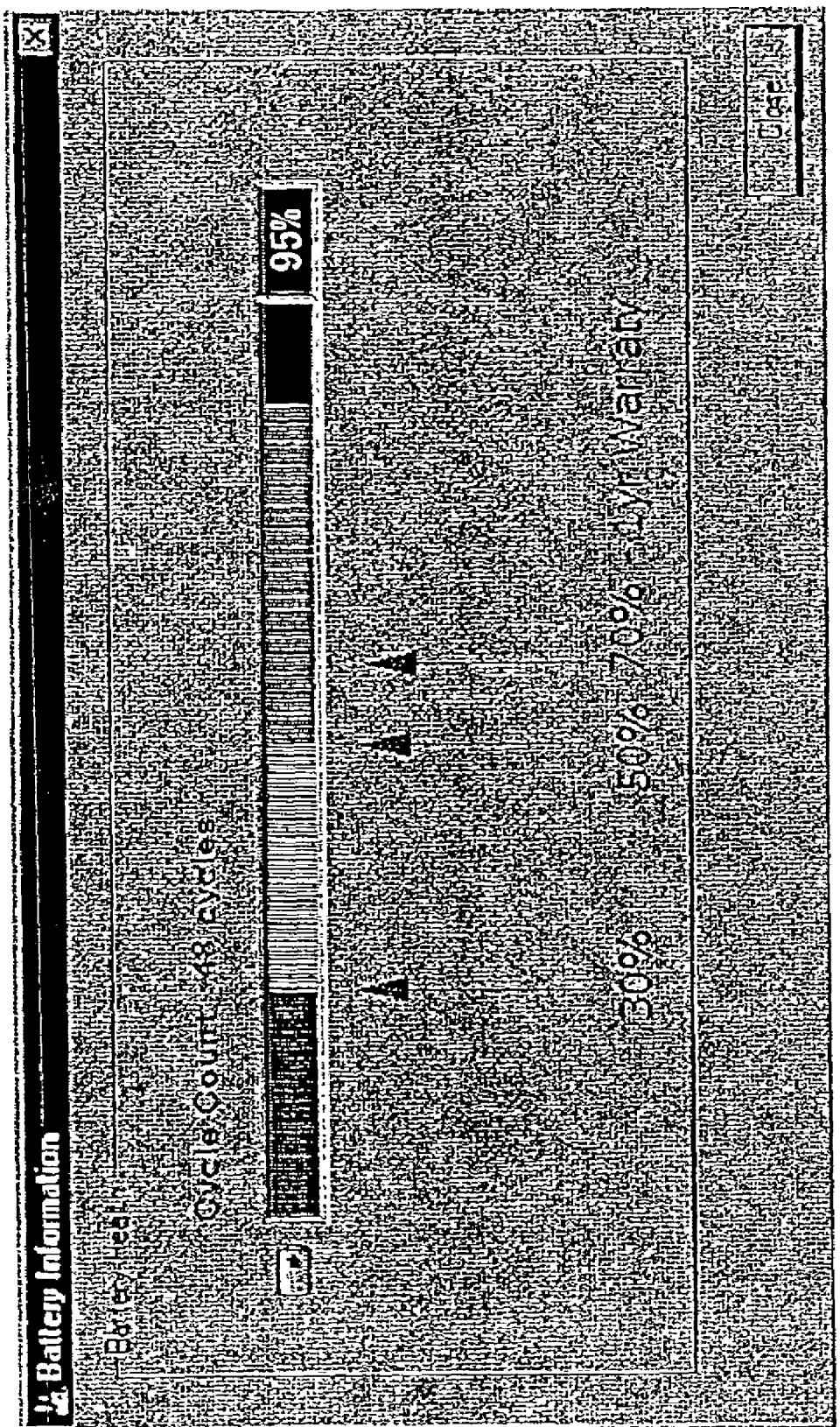
FIG. 8 shows an example for indication of a deterioration degree of a battery by using a battery diagnosis program.

FIG. 8 shows an example for indication of deterioration degree of a battery by using a battery diagnosis program. Such information on a deterioration degree is indicated, for example, on a liquid crystal display (LCD) 18 as shown in FIG. 1, in response to execution of a utility program provided with information from the embedded controller 41. The example of indication shown in FIG. 8 is an example for a battery that has experienced 48 cycles of charging/discharging. The initial capacity is 100% and a capacity deterioration of 5% has occurred, resulting in a Full Charge Capacity of 95% of the initial capacity. Color indication may be performed, for example, in a gradational or continuous manner, in such a way that when Full Charge Capacity is 51 to 100%, the graph is colored with green to show that replacement of the battery is not necessary, and when Full Charge Capacity is 31 to 50%, the graph is colored with yellow to show that it is the time for battery replacement, and when Full Charge Capacity is 0 to 30%, the graph is colored with red to show that there is a possibility of malfunction of low battery hibernation or the like. So, the user can be notified of a deterioration degree of the battery and the time for replacement of the battery, in a visible manner. While a warranty period of a battery is typically one year since the purchase of the battery, the capacity of a normal battery does not lower to 70% or less of the initial capacity after one year use. Therefore, the indication to suggest to a user that the battery should be replaced is not performed as long as the battery is in the warranty period.

Here, the low battery hibernation function is a function to forcibly save various statuses in PC operation into a disc when the capacity of the battery (intelligent battery 52) reaches a predetermined lower limit capacity. Typically, when the capacity of battery reaches the lower limit, it is possible to operate the disc to complete required saving operations by using the power remnant in the battery. However, if a battery is deteriorated, there may occur a rapid reduction of capacity after the capacity reaches the predetermined lower limit. Then, there can be a case where supply of power from the battery is stopped before saving operations are completed. Therefore, in this embodiment, for example, color indication with red is performed to alert the user to such a case.

As described above in detail, according to this embodiment, even if complete discharging is not performed, automatic correction of Full Charge Capacity is executed in the battery pack and it is possible to indicate a deterioration degree of the battery immediately in response to a user request. Specifically, in the prior art, it is not possible to update Full Charge Capacity (that is, no learning) unless discharging is completely performed substantially to 0% of battery capacity, and it is not possible to notify a user of an accurate deterioration degree unless the notification is made just after complete discharging. According to this embodiment, it is possible to notify a user of an accurate deterioration degree whenever the user wants to know it, so as to provide a device with good usability for a user.

In the example described above, the CPU 62 of the intelligent battery 52 measures a deterioration degree of the battery, and data on Full Charge Capacity based on the amount of deterioration is sent to the embedded controller 41. Another embodiment is also possible. For example, there is a method wherein the capacity learning about Full Charge Capacity is performed only for complete discharging and deterioration values (cycle deterioration and storage deterioration) is stored in a memory. In such a case, in response to commands from the embedded controller 41, data on Full Charge Capacity and data on the deterioration are separately sent to the embedded controller 41. The embedded controller 41 subtracts therein the deterioration data value from the data on Full Charge Capacity to provide a corrected Full Charge Capacity. In such a configuration, even if direct correction is not performed in the intelligent battery 52, it is also possible to obtain a Full Charge Capacity corrected at the embedded controller 41.

As described above, according to the invention, a deterioration degree of a battery can be easily detected in a device having the battery.

DESCRIPTION OF SYMBOLS

10 . . . Computer system
11 . . . CPU
18 . . . Liquid crystal display (LCD)
41 . . . Embedded controller
50 . . . Power supply circuit
51 . . . AC adapter
52 . . . Intelligent battery
61 . . . Cell
62 . . . CPU
63 . . . Current measuring circuit
70 . . . Voltage measuring circuit
74 . . . Communication line
75 . . . Voltage measuring circuit
76 . . . Battery connection confirming terminal
80 . . . AC adapter power stop circuit
90 . . . Temperature measuring circuit
91 . . . Thermistor (thermal sensor)

It is to be understood that the above described arrangements are merely illustrative of the application of principles of the invention and that other arrangements may be devised by someone skilled in the art without departing from the spirit and scope of the invention.

The invention claimed is:

1. A total capacity correcting method for correcting a total capacity of a battery for charging/discharging and supplying power to a main unit, comprising the steps of:
    integrating a charging amount for said battery;
    determining whether the integrated charging amount teaches a total capacity monitored in advance, or not; and
    incrementing a cycle count when the integrated charging amount reaches the total capacity, and performing correction for a deterioration value based on cycle deterioration to calculate a modified total capacity, the method rendering the modified total capacity based at least in part on both the correction for the deterioration value based on cycle deterioration, and on a storage deterioration of the battery.

2. A program product comprising:
    computer readable media on which a computer program is implemented, said computer program including computer code providing a function to monitor a cycle deterioration that is a capacity deterioration due to charging/discharging of a battery;
    computer code providing a function to monitor a storage deterioration that is a capacity deterioration clue to storage of said battery; and
    computer cods providing a function recognizing the deterioration value of said battery based on said monitored cycle deterioration and storage deterioration.

3. An electric device, comprising:
    a main unit consuming power:
    a battery for supplying the power to the main unit, and
    means to update a value of total capacity of said battery depending on non-operative state of the battery wherein said non-operative state of the battery includes correction for cycle deterioration, the cycle deterioration being a ratio of the battery when fully charged ("Full Charge Capacity") and an initial fully charged state charge capacity of the battery ("Design Capacity"), wherein the Full Charge Capacity in a second charge cycle following a first charge cycle is the Full Charge Capacity of the first charge cycle—Design Capacity×0.5/500.

* * * * *